(12) United States Patent
Bottari

(10) Patent No.: US 6,280,552 B1
(45) Date of Patent: Aug. 28, 2001

(54) METHOD OF APPLYING AND EDGE ELECTRODE PATTERN TO A TOUCH SCREEN AND A DECAL FOR A TOUCH SCREEN

(75) Inventor: Frank J. Bottari, Acton, MA (US)

(73) Assignee: MicroTouch Systems, Inc., Methuen, MA (US)

(*) Notice: Subject to any disclaimer, the term of this patent is extended or adjusted under 35 U.S.C. 154(b) by 0 days.

(21) Appl. No.: 09/365,100

(22) Filed: Jul. 30, 1999

(51) Int. Cl.⁷ ............ B44C 1/165; B32B 31/04; B32B 31/20; C09J 32/00; H01R 12/00
(52) U.S. Cl. ............ 156/230; 156/233; 156/239; 156/240; 156/247; 156/289; 156/277; 156/273.3; 156/89.12; 427/146; 427/148; 427/149; 428/914; 439/77; 29/825
(58) Field of Search ............ 156/230, 233, 156/236, 237, 240, 241, 247, 277, 289, 272.2, 272.3, 89.12; 427/146, 147, 148, 149; 439/77, 85; 29/825, 846; 428/914

(56) References Cited

U.S. PATENT DOCUMENTS

| 2,711,983 | 6/1955 | Hoyt . |
| 3,729,819 | * 5/1973 | Horie ............ 29/625 |
| 4,369,063 | 1/1983 | McGowan, Jr. . |
| 4,694,573 | * 9/1987 | Nishino et al. ............ 29/846 |
| 4,697,885 | * 10/1987 | Monowa et al. ............ 350/334 |
| 4,846,869 | 7/1989 | Palanisamy . |
| 5,346,651 | 9/1994 | Oprosky et al. . |

* cited by examiner

Primary Examiner—Richard Crispino
Assistant Examiner—J. A. Lorengo
(74) Attorney, Agent, or Firm—Landiorio & Teska (57) ABSTRACT

A method of applying an edge electrode pattern to a touch screen panel including printing an edge electrode pattern on decal paper; applying a cover coat over the electrode pattern; removing the decal paper; and transferring the edge electrode pattern to a touch screen panel. A decal to be used in accordance with this method.

23 Claims, 6 Drawing Sheets

METHOD OF APPLYING AND EDGE ELECTRODE PATTERN TO A TOUCH SCREEN AND A DECAL FOR A TOUCH SCREEN

FIELD OF INVENTION

This invention relates to a novel method of applying an edge electrode pattern to a touch screen and a decal for applying an edge electrode pattern to a touch screen.

BACKGROUND OF INVENTION

Touch screen panels generally comprise an insulative (e.g. glass) substrate and a resistive layer disposed on the insulative substrate. A pattern of conductive electrodes are then formed on the edges of the resistive layer. The conductive electrodes form orthogonal electric fields in the X and Y directions across the resistive layer. Contact of a finger or stylus on the panel then causes the generation of a signal that is representative of the X and Y coordinates of the location of the finger or the stylus with respect to the substrate. In this way, the associated touch panel circuitry can ascertain where the touch occurred on the substrate. Typically, a computer program generates an option to the user (e.g. "press here for 'yes' and press here for 'no'") on a monitor underneath the touch screen panel and the conductive electrode pattern assists in detecting which option the user chose when the touch screen panel was touched by the user.

Normally, the edge electrode pattern is printed directly on the resistive layer of the touch screen panel. Screen printing techniques are used to deposit silver/frit ink directly onto the glass sensor coated with a thin layer of tin oxide. After the pattern is printed, the wet ink is normally dried by heating the panel to about 100° C. for about 5 minutes to reduce the chance that the ink could be removed during subsequent handling. The ink is then fired at about 500° C. for about 20 minutes to sinter and fuse the silver/glass frit mixture to the tin oxide coated glass substrate. This process produces an edge electrode pattern that is mechanically bonded to the touch screen panel and which makes good electrical contact with the tin oxide layer.

The screen printing process, however, can lead to a number of problems when attempts are made to achieve a quality edge electrode pattern. The most severe problem occurs when printing on non-flat or curved glass substrates. In screen printing, a critical parameter in determining the charactstics of the printed pattern is the distance between the printing screen and the substrate. When printing on curved substrates, this distance varies with the degree of curvature of the substrate resulting in non-uniform thickness of the printed ink. Furthermore, automated screen-printing equipment, which requires a uniform and repeatable force to push the ink through the printing screen, can not be used with curved screens due to the mismatch of the flat printing screen and the non-flat substrate. In this case, the curved screens can only be printed by manually forcing the ink through the printing screen with a squeegee. The non-reproducible force used in this manual process leads to further variations in the thickness of the printed ink. Frequently, this process also leads to fatal defects in the edge electrode pattern such as complete breaks in the conductive lines of the electrode pattern which subsequently require additional time and labor to rework or reprocess the touch screen panel.

In various fields of technology which are not analogous to the production of touch screens, it is known to apply electrode patterns to a glass surface using a decal transfer method. See, for example, U.S. Pat. Nos. 4,369,063; 4,846,869; 5,346,651; and 2,711,983. These prior art decal transfer methods are typically used only in conjunction with flat substrates. For example, U.S. Pat. No. 4,846,869 describes a method of applying electrode sensors to a wind shield by first applying the electrode pattern to the windshield when it is flat and then heating the windshield to shape it into its final curved form. This method can not be used to apply electrode patterns to glass substrates in the manufacture of touch screens because the glass must be curved or bent before the edge electrode pattern can be applied. The reason is that the resistive coating must be applied before the electrode pattern is applied and such a coating cannot withstand the high temperatures which are required to bend glass. U.S. Pat. No. 2,711,983 discloses a method of applying printed electric circuits to curved support surfaces by the use of a decal. In this case, however, the support surface is not a part of the electrical circuit. And it would be undesirable for the decal to make electrical contact with the support surface. In contrast, in the manufacture of touch screens, the support surface is an integral part of the circuit and it is essential that the electrodes make intimate electrical contact with the resistive tin oxide surface.

After the edge electrode pattern is applied by printing techniques to the touch screen panel, the next step is to connect individual wires to the corner electrodes at the four corners of the touch screen panel. Typically, the ends of each wire are soldered to the corner electrodes and the individual wires taped to the sides of the panel. In some cases, an insulative layer, usually in the form of some kind of a tape, is placed in a border configuration around the perimeter of the touch screen panel between the edge electrodes and the individual wires which form a part of the control electronics. In still other cases, a conductive noise shield, also a layer of tape, is placed on top of the wires again in a border configuration around the perimeter of the touch screen panel.

The result is a touch screen panel with a less than finished appearance since the bulky wires are readily noticeable. Also, the act of soldering the ends of the wires to the corner electrodes can damage the corner electrodes or even damage the substrate. Worse, the solder joints have a tendency to fail.

SUMMARY OF INVENTION

It is therefore an object of this invention to provide a new method of applying an edge electrode pattern to a touch screen panel.

It is a further object of this invention to provide a new method of attaching a wiring harness to the edge electrode pattern.

It is a further object of this invention to provide a decal for a touch screen panel which can be used to apply an edge electrode pattern and even the wiring harness to the touch screen panel.

It is a further object of this invention to provide such a method and such a decal which facilitates the application of a precise electrode pattern of uniform thickness to touch screen panels of any shape.

It is a further object of this invention to provide such a method and such a decal which allows multiple layers of conductive ink to be applied to the panel in one step thereby eliminating the often difficult and imprecise re-registration of the pattern with respect to the panel.

It is a further object of this invention to provide such a method and such a decal which reduces printing defects and eliminates the need to rework the electrode pattern.

It is a further object of this invention to provide such a method and such a decal which results in improved quality touch screens.

It is a further object of this invention to provide such a method and such a decal which reduces the cost of manufacturing touch screen panels.

It is a further object of this invention to provide such a method and such a decal which eliminates the use of toxic organic solvents in the manufacture of touch screen panels.

This invention results from the realization that many of the problems associated with printing the edge electrode pattern directly on a touch screen panel, especially curved touch screen panels, can be eliminated by using a decal to transfer the edge electrode pattern and even the conductive lands or leads and optional noise shield and/or protective layers directly to the touch screen panel because the decal can be screen printed in a flat configuration and then flexed and used to transfer the edge electrode pattern to even a curved touch screen panel.

This invention features a method of applying an edge electrode pattern to a touch screen panel. The method comprises depositing an edge electrode pattern on a decal layer; applying a cover coat over the electrode pattern; removing the decal layer; and transferring the edge electrode pattern to a touch screen panel. The step of depositing the edge electrode pattern on the decal layer typically includes printing the edge electrode pattern on the decal layer around the perimeter thereof. The cover coat is usually a lacquer material.

In one embodiment, the decal layer is paper with a starch coating on a least on surface thereof and the step of depositing includes disposing the edge electrode pattern on the starch coated surface.

In another embodiment, the decal layer is paper with a wax coating on at least one surface thereof and the step of depositing includes disposing the edge electrode pattern on the wax coated surface. The step of removing the decal layer includes the dissolving the starch coating or melting the wax coating and removing the cover coat and edge electrode pattern from the decal layer.

The step of transferring typically includes placing the cover coat and edge electrode pattern on the touch screen and heating and touch screen to burn off the cover coat and to bond the electrode pattern to the touch screen.

In another embodiment, conductive lands are deposited over the decal layer before the cover coat is applied. The step of depositing the conductive lands preferably includes printing an insulative layer over selected portions of the edge electrode pattern and printing conductive lands on the insulative layer. The insulative layer is usually a dielectric material. A noise shield layer and/or a protective layer may be applied over the conductive lands before the cover coat is applied.

In order to place the conductive lands on the back surface of the touch screen, the step of depositing the conductive land includes printing an insulative border layer on the decal layer proximate the edge electrode pattern and printing the conductive lands on the insulative border layer. The step of transferring then includes placing the cover coat on the touch screen panel with the edge electrode pattern located peripherally on one surface of the touch screen and folding the insulative border layer on to an opposite surface of the touch screen panel to locate the conductive lands peripherally about the opposite surface of the touch screen panel.

This invention also features the product manufactured in accordance with the above methods.

This invention also features a decal for a touch screen, the decal comprising a decal layer; an edge electrode pattern deposited on the decal layer; and a cover coat over the electrode pattern.

The cover coat usually includes a lacquer material. The decal layer may be paper with a starch coating on at least one surface thereof and the edge electrode pattern located on the starch coated surface. Alternatively, the decal layer is paper with a wax coating on at least one surface thereof and the edge electrode pattern located on the wax coated surface.

A decal with an integral wiring harness in accordance with this invention further includes an insulative layer disposed over selected portions of the edge electrode pattern and conductive lands printed on the insulative layer under the cover coat. The insulative layer is typically made of a dielectric material and there may also be at least one of a noise shield layer and a protective layer disposed over the conductive lands under the cover coat.

In another embodiment, the decal's edges are folded over the back side of the touch screen panel and in that embodiment there is an insulative border layer on the decal layer proximate the edge electrode pattern and printed conductive lands on the insulative border layer.

Even more broadly, this invention features a method of and a decal for applying a conductive pattern to a touch screen. The conductive pattern could be a series of peripheral edge and corner electrodes, a noise shield conductive land pattern on the back of the touch screen, spacer dots for resistive touch screen panels, and the like.

In still another embodiment, the method comprises depositing a pattern on a decal layer, assembling the decal layer on a touch screen panel, and applying heat and pressure to the decal layer to transfer the pattern to the touch screen panel.

BRIEF DESCRIPTION OF DRAWINGS

Other objects, features and advantages win occur to those skilled in the art from the following description of a preferred embodiment and the accompanying drawings, in which.

DISCLOSURE OF PREFERRED EMBODIMENT

Figure 1:
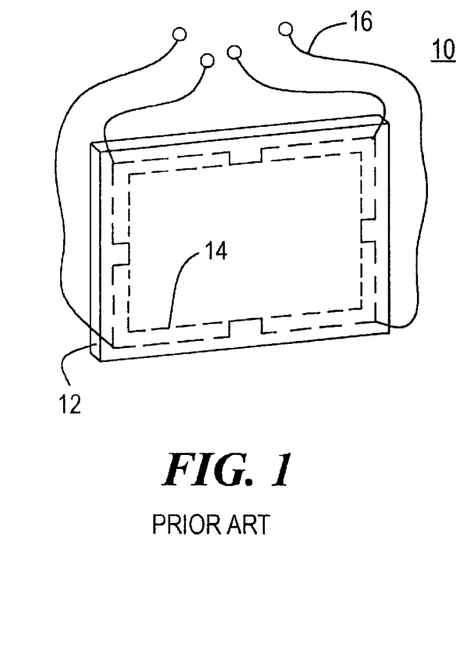
FIG. 1 is a schematic view of a prior art touch screen panel.

Touch screen panel 10, FIG. 1, typically includes a glass substrate 12 coated with a resistive layer such as tin oxide upon which are deposited edge electrodes 14 usually by screen printing as discussed for example in U.S. Pat. No. 4,198,539. Wires 16 are each connected to a different corner electrode of pattern 14 as shown. As discussed in the Background of the Invention above, these wires are typically taped to the edges of panel 10. In some embodiments, an insulative layer is disposed in a border configuration around the perimeter of panel 10 over edge electrode pattern 14 between edge electrode pattern 14 and wires 16 and in still other embodiments, a conductive noise shield layer and possibly a protective layer may be disposed over the insulative layer. A noise shield border layer may also be screen printed peripherally on the back of the touch screen panel shown in FIG. 1.

As discussed in the Background of the Invention above, when the touch screen panel is curved, it is very difficult to screen print electrode pattern 14 on the curved panel. Even with respect to flat panels, however, the screen printing process is often troublesome. For example, in some cases, thick soldering pads are placed on each corner electrode for reliable bonding and it can be difficult to screen print these multiple layers of conductive ink. In other cases, the glass substrate of the panel is etched or textured to reduce reflections and glare and it can be very difficult to screen print an edge electrode pattern of uniform ink thickness due to the peaks and valleys produced by the texturing.

Figure 2:
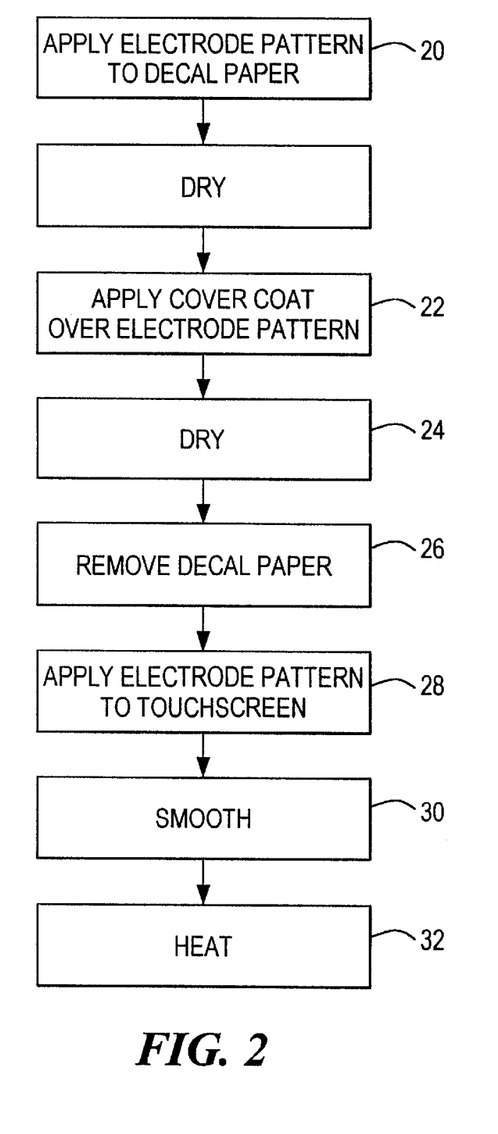
FIG. 2 is a flow chart depicting the primary steps associated with the method of applying an edge electrode pattern to a touch screen in accordance with the subject invention.

Accordingly, in the subject invention, a conductive pattern such as electrode pattern 14 is first applied by screen printing it on standard decal paper, step 20, FIG. 2. The decal paper may be a standard water-slide paper from Bel, Inc., Miami, Fla. Using conventional screen printing techniques, a silver/glass frit ink is screen printed onto standard flat decal paper which has a starch coating or a wax coating on one surface thereof. The frit ink electrode pattern is then allowed to dry and then an acrylic lacquer cover coat is applied over the frit material, steps 22 and 24, FIG. 2. This decal sheet may then be stored before using. In one embodiment, Philadelphia Decal, 6017 Keystone Street, Philadelphia, Pa. 19135, performed steps 20–24 using Ferro 3350 silver frit ink supplied by the applicant.

In order to transfer the electrode pattern to a touch screen panel, the decal paper layer is removed, step 26. If starch coated decal paper is used, the decal is immersed in water for about one minute to dissolve the starch layer. As the starch dissolves, the silver/frit pattern, which is adhered to the cover coat, can be removed from the paper backing. Normal practice is to slide the decal off the paper and on to the touch screen, step 28. If the decal paper is wax coated, the decal paper is removed from the acrylic lacquer cover coat by heating the decal to melt the wax.

Once in the designated location on the touch screen panel, the decal is smoothed out with a squeegee, step 30 to remove any excess water and to effect its firm adhesion to the touch screen panel. The decal follows the curvature of curved touch screen panels without compromising the quality of the printed pattern and is thus particularly suited for curved touch screen panels. At this point, the touch screen panel may be handled without any special precautions.

This is an improvement over the prior art screen printing process which requires a high temperature drying step before handling. The applied decal in accordance with this invention, however, is more adherent to the touch screen panel and more robust in the pre-fired state than screen printed ink due to the protective nature of the decal cover coat. The final step is to heat the touch screen panel with the applied decal under the same conditions as a standard screen printed panel, step 32. During heating, the decal cover coat burns off cleanly and completely and the silver/frit edge electrode pattern electrically and mechanically bonds with the touch screen panel.

Typically, the edge electrode pattern is printed on the decal layer around the perimeter thereof in order to form an electrode pattern which has the exact same configuration as the ultimate edge electrode pattern on the touch screen panel. Although conductive inks are preferred, conductive polymers can also be used in place of the metal/glass frit mixture. The material of the cover coat may be an acrylic lacquer from Bel, Inc., Miami, Fla.

Figure 3:
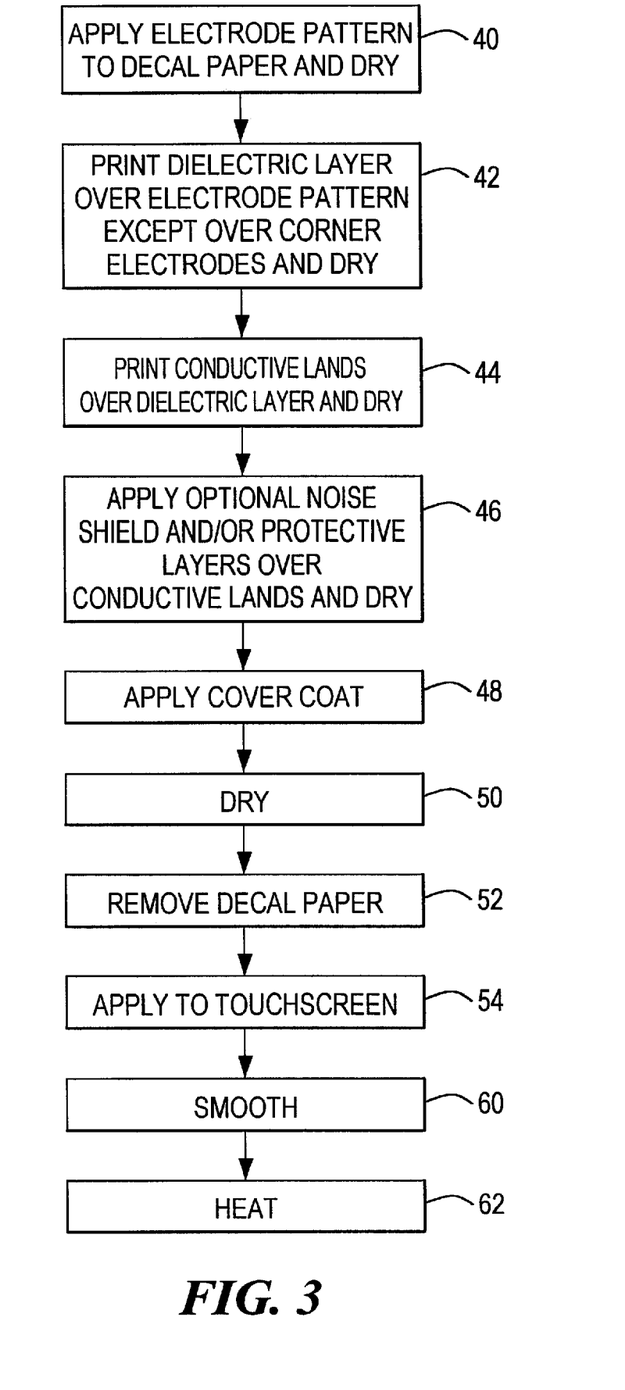
FIG. 3 is a flow chart depicting the primary steps associated with the method of applying a combined edge electrode pattern and a wiring harness to a touch screen panel in accordance with the subject invention.

Using a similar methodology, the wiring harness can also be applied to the panel eliminating the need to solder individual wires to the corner electrodes of the edge electrode pattern. In step 40, FIG. 3, the edge electrode pattern is applied to the decal paper layer similar to step 20, FIG. 2. Next, however, a dielectric layer such as a lead borosilicate glass material is screen printed over the electrode pattern except in the areas of the corner electrodes, step 42, FIG. 3. Conductive lands or leads are then screen printed over the dielectric layer, step 44, such that one land extends to each corner electrode and makes electrical contact therewith since there is no dielectric deposited over the corner electrodes. At this stage in the processing, an optional noise shield and/or protective layers may be screen printed over the protective lands, step 46, and then the cover coat is applied, step 48, similar to step 22, FIG. 2. This assembly is allowed to dry, step 50; the decal paper layer is removed, step 52, similar to step 26, FIG. 2; and the decal is then applied to the touch screen, step 54. The smoothing step 60 and heating step 62, FIG. 3, are similar to steps 30 and 32, FIG. 2.

The dielectric material used in step 42 can be a lead borosilicate glass composition as supplied by Ferro Corp., product 10–060. The noise shield material is usually the same silver/frit conductor paste, Ferro 3350, used for the electrode pattern. The protective layer material may be a lead borosilicate glass overglaze composition, similar to the dielectric layer but with a higher reflow temperature such as Ferro 11–045.

The decal is heated to a temperature of about 450° C. for about 10 minutes and then the temperature is increased to about 500° C. for about 10 minutes. This allows burnout of the organic components of the inner layers before the protective outer layer forms.

The conductive lands may be screen printed using the same conductive ink which forms the electrode pattern for compatibility. The decal paper layer and the cover coat layer are usually approximately the same size as the touch screen panel but may include slits or orifices therethrough in the center region of the decal for handling purposes. The dielectric, noise shield, and protective layers, however, could be complete sheets but could also just be in a border configuration around the perimeter of the decal paper.

Figures 4, 5:
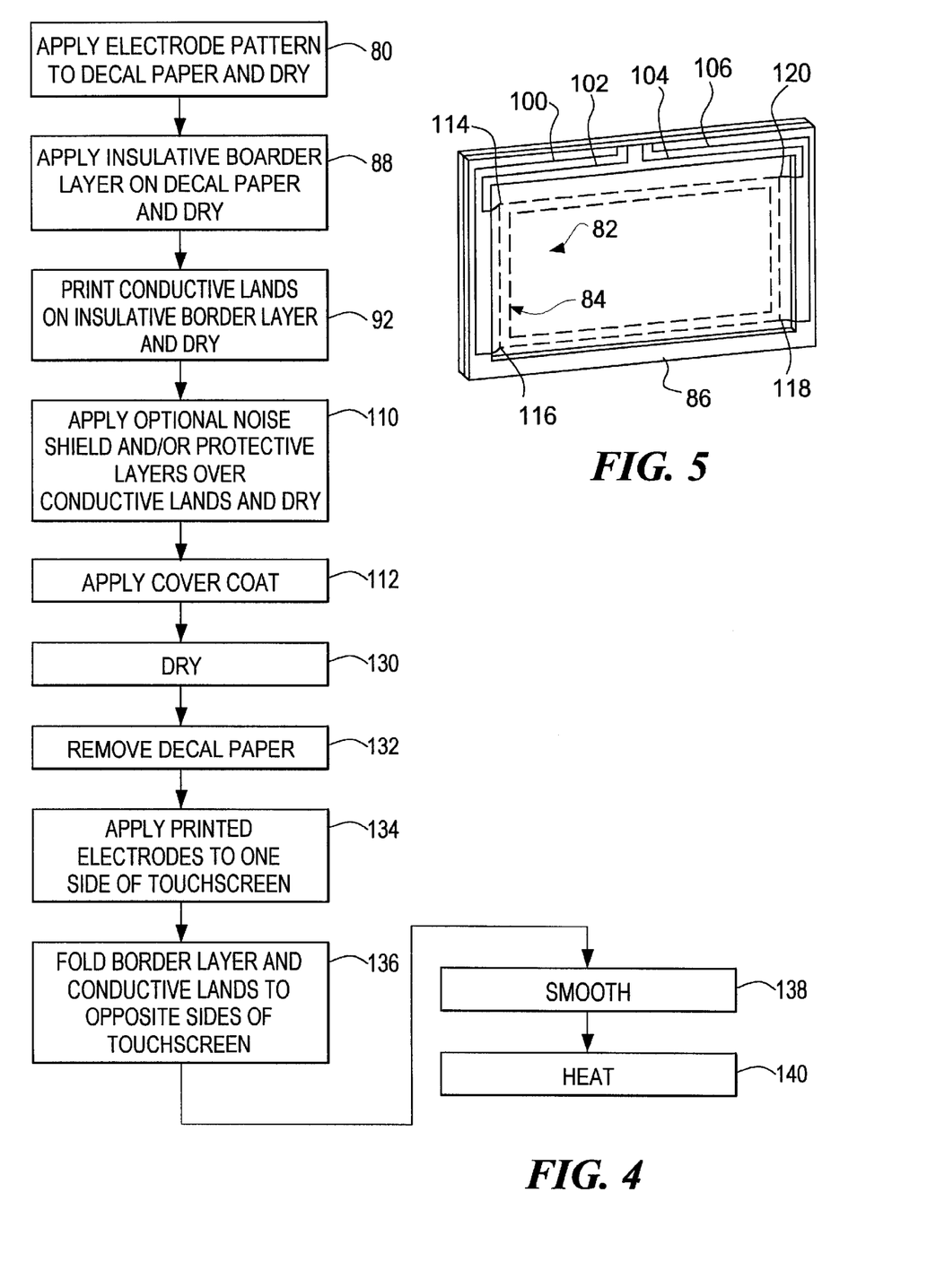
FIG. 4 is a flow chart depicting the primary manufacturing steps associated with an alternative method of applying a combined edge electrode pattern and a wiring harness to a touch screen panel in accordance with the subject invention.
FIG. 5 is a schematic top view of a decal used in accordance with the method of the subject invention.

This is especially true in connection with the manufacturing steps shown in FIG. 4. In this embodiment, the conductive lands or leads will ultimately be placed on the surface of the touch screen panel opposite the edge electrode pattern. For example, the edge electrode pattern is normally thought to be on the "top" surface of the touch screen panel and in accordance with the subject invention a specialized decal can be made to dispose the electrical leads on the back or "bottom" of the touch screen panel.

Again, the edge electrode pattern is screen printed onto standard decal paper, step 80, FIG. 4. As shown in FIG. 5, the decal paper is at 82 and the edge electrode pattern is shown schematically at 84. An insulative border layer is applied to the decal paper, step 88, FIG. 4 as shown at 86, FIG. 5. The conductive lands are then printed on the insulative border, connecting with the corner electrodes step 92 as shown for conductive lands 100, 102, 104, 106, FIG. 5. Optional noise shield and/or protective layers may then be placed over electrode pattern 84 and conductive lands 100, 102, 104, and 106, step 110, FIG. 4 and a cover coat is then applied as discussed above, step 112 over decal paper 82 and covering all printed layers step 112, FIG. 4. In FIG. 5, insulative border layer 86 is shown to be relatively thick but in actuality it is very thin. At each corner electrode, a conductive land is screen printed to make electrical contact with a corner electrode as shown at 114, 116, 118, 120, FIG. 5. After each printing step, the ink is allowed to dry.

The exact order of steps 88–112 does not necessarily have to be as set forth in FIG. 4. In fact, step 88 may be performed first and then the two printing steps 80 and 92 performed at the same time.

When applied to the touch screen panel, each conductive land will extend around a portion of the perimeter of the back or bottom surface of the touch screen panel, up over the edge of the touch screen panel, and then along the front of the touch screen panel where it makes electrical and physical contact with a respective corner electrode.

Once the cover coat is applied, this assembly is allowed to dry, step 130, and the decal paper layer removed, step 132, similar to step 26, FIG. 2. The cover coat is then located with respect to the touch screen panel such that the edge electrodes 84, FIG. 5, are properly oriented on the perimeter of one surface of the touch screen panel, step 134, and then border layer 86 is folded onto the opposite surface of the touch screen panel to correctly align the conductive lands on the opposite side of the touch screen from the edge electrode pattern, step 136, FIG. 4. The smoothing and heating steps 138 and 140 are similar to steps 30 and 32, FIG. 2.

Therefore, in accordance with this invention, the decal itself may include the electrical leads in the form of conductive lands as a part of the decal either on the same side as and separated from the edge electrodes by an insulative layer or on the opposite side of the touch screen panel and applied to a separate border insulative layer. The insulative layer (or layers) is typically a dielectric material such as a lead borosilicate glass composition.

The decal of the subject invention could also be configured to apply a reflector pattern including glass frit for surface acoustic wave touch screen panels. In addition, the decal of the subject invention can be used to apply the spacer dots between the individual layers of material associated with resistive touch screen panels.

Therefore, this invention provides a new method of applying an edge electrode pattern to a touch screen panel. Instead of screen printing the edge electrode pattern directly onto the touch screen panel, a process which yields unsatisfactory results especially on curved panels, the edge electrode pattern is first screen printed on flat decal paper and this decal is then used to transfer the edge electrode pattern to the touch screen panel.

Figure 6:
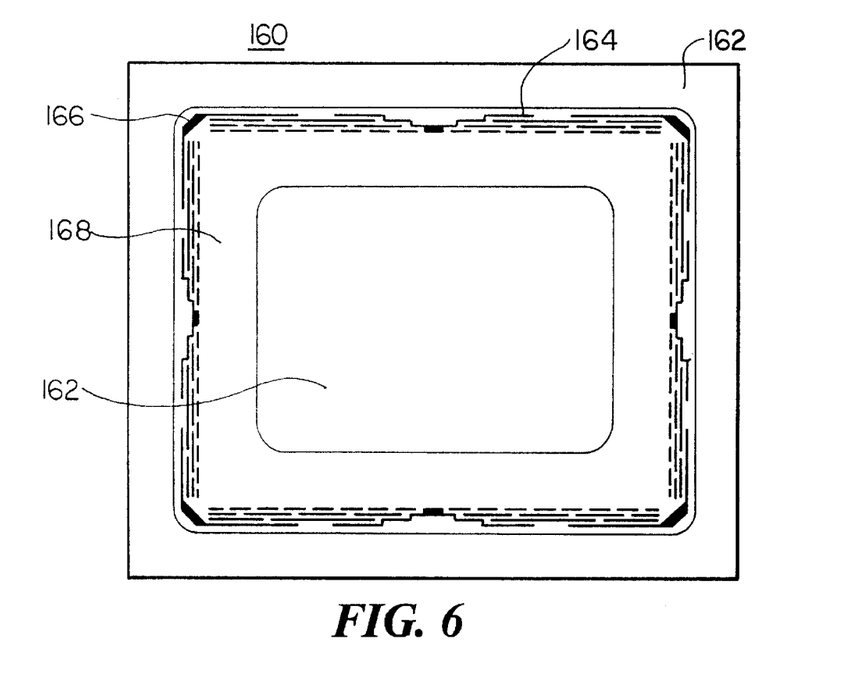
FIG. 6 is a top view of an actual decal used to apply an edge electrode pattern to a touch screen panel in accordance with this invention.
Figure 8:
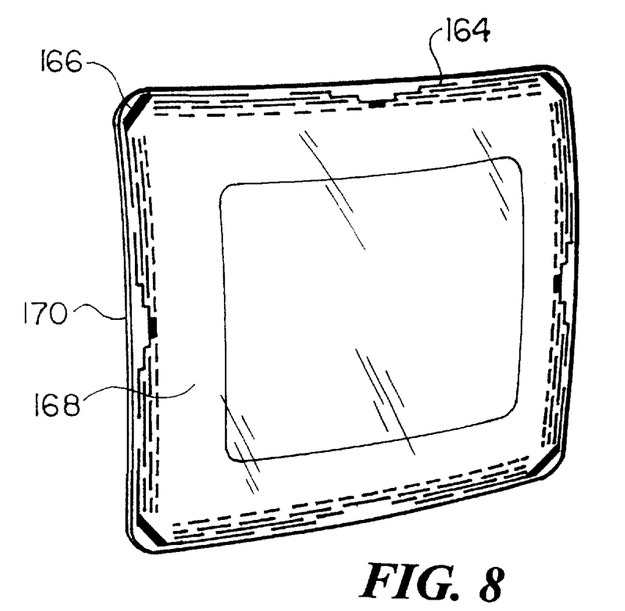
FIG. 8 is a front view of a touch screen panel in accordance with this invention with the edge electrode pattern decal of FIG. 6 applied thereto but not yet fired.

As shown in FIG. 6, decal 160 includes decal paper 162, edge electrode pattern 164 with corner electrodes such as corner electrode 166, and cover coat 168 here disposed in a border configuration over edge electrode pattern 164. This decal, once placed in water to remove decal paper 162, is conveniently placed on the front surface of curved touch screen 170, FIG. 8 and then fired. Prior art printing methods, as described above, do not lend themselves to use with curved touch screen panel 170.

Figure 7:
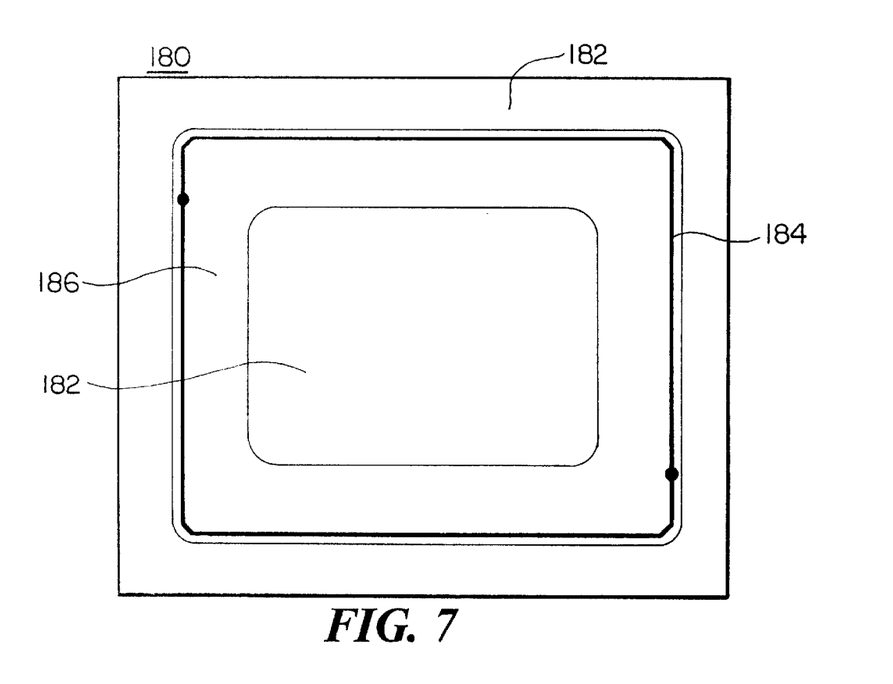
FIG. 7 is a top view of a decal used to apply a noise shield to a touch screen panel in accordance with this invention.
Figure 9:
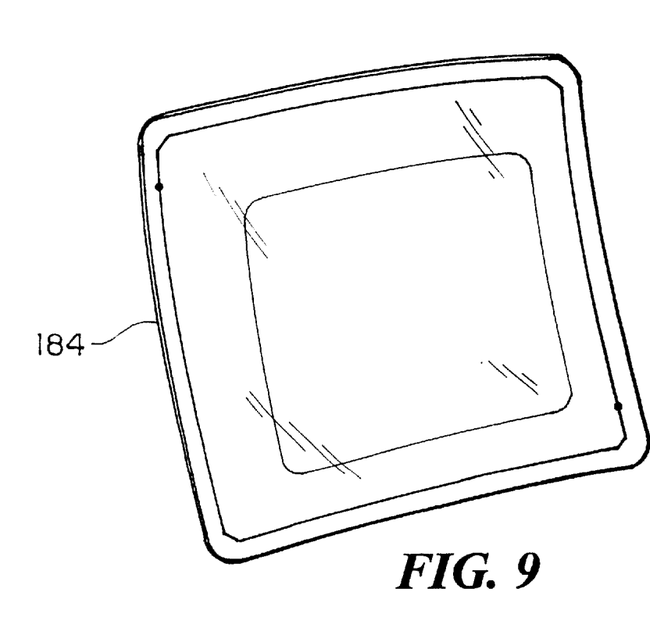
FIG. 9 is a rear view of the touch screen panel shown in FIG. 8 showing the noise shield decal of FIG. 7 applied thereto.

Decal 180, FIG. 7 includes decal paper 182, a conductive pattern such as noise shield perimeter land 184 and cover coat 186 in a border configuration over noise shield land (e.g. conductive ink) 184. This decal, once placed in water to remove decal paper 182, is placed on the rear surface of curved touch screen 184, FIG. 9 and then fired. Land 184 is printed on decal paper 182 using the same process used to print edge electrode pattern 164, FIG. 6 on decal paper 162.

In one embodiment, the completed touch panel typical includes a glass substrate 1–3 mm thick, a resistive layer of tin oxide or antimony tin oxide 0.05 $\mu$m thick on the front surface thereof, a silver frit or conductive ink edge electrode pattern about the periphery thereof on the resistive layer about 15 $\mu$m thick, and a dielectric border layer printed over the edge electrode pattern approximately 25 $\mu$m thick except in the areas of the corner electrodes of the edge electrode pattern. Printed on this dielectric border layer are 20 $\mu$m thick conductive lands extending to each corner electrode of the edge electrode pattern. Another 25 $\mu$m thick dielectric layer is then printed in a border configuration over the conductive lands. An optional noise shield layer 20 $\mu$m thick made of conductive ink may be printed in a border configuration over this dielectric layer and another protective dielectric layer 25 $\mu$m thick may be printed in a border configuration over the noise shield layer.

One decal which is used to manufacture this embodiment thus includes the decal paper and printed thereon in successive layers the conductive edge electrode pattern, the dielectric layer insulating the conductive lands printed thereon from the edge electrode pattern, the dielectric layer insulating the noise shield layer printed thereon from the conductive lands, the optional protective dielectric layer over the noise shield layer, and on top of all these layers, the cover coat.

This invention also provide a new method of attaching a wiring harness to the edge electrode pattern. Instead of individual wires soldered to the corner electrodes of the edge electrode pattern, screen printed lands or leads are deposited right on the decal.

In this way, a precise electrode pattern of uniform thickness can be applied to touch screen panels of any shape. Multiple layers of conductive ink can be applied to the panel in one step thereby eliminating the often difficult and imprecise re-registration of the pattern with respect to the panel. Printing defects are reduced and the need to rework the electrode pattern is eliminated. The result is improved quality and lower cost touch screens. The use of toxic organic solvents in the manufacture of touch screen panels is eliminated.

The problems associated with printing the electrode pattern directly on a touch screen panel, especially curved touch screen panels, is eliminated in this invention by using a decal to transfer the edge electrode pattern and even conductive lands and optional noise shield and/or protective layers directly to the touch screen panel. The decal is screen printed in a flat configuration and then used to transfer the edge electrode pattern to even a curved to touch screen panel. The method of his invention is not necessarily limited to conductive edge electrode patterns, however. Other types of touch screens have a pattern of spacer dots separating a flexible membrane from a substrate. Still other touch sensors have a pattern of reflective elements on the substrate. In accordance with this invention, these patterns can be applied to touch screen panel in accordance with the decal methodology discussed above by first putting the pattern on a decal paper and then transferring the pattern to the touch screen panel.

Figure 10:
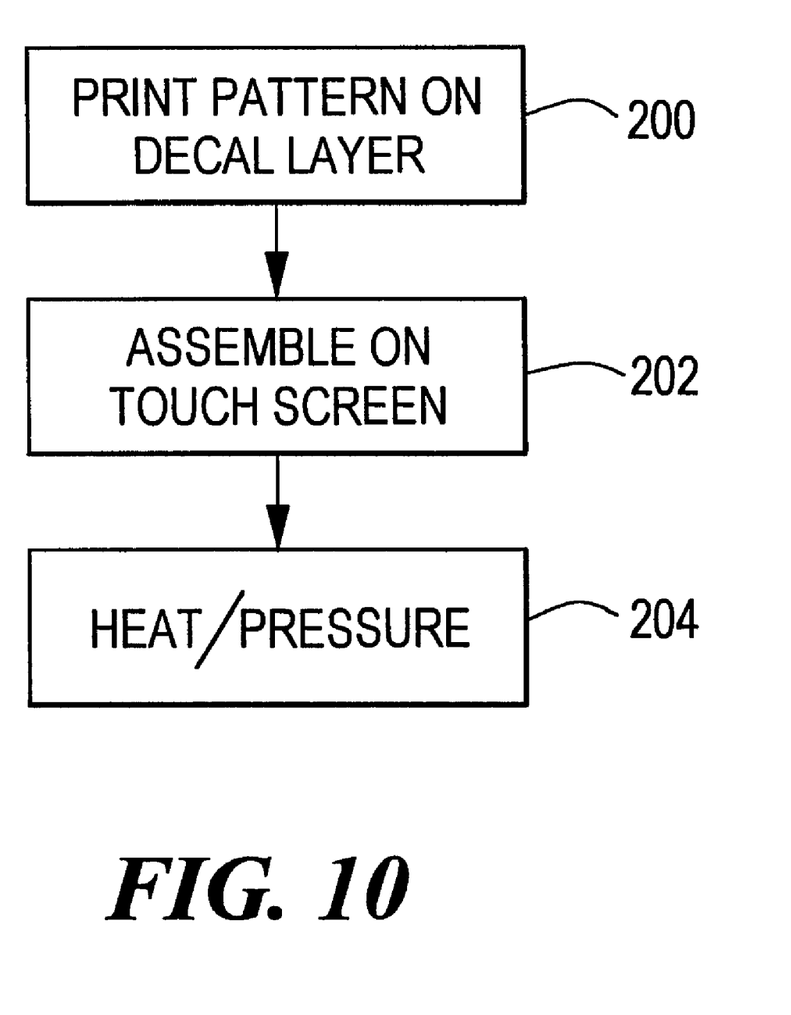
FIG. 10 is a flow chart depicting the steps associated with another embodiment of the subject invention.

In still another embodiment, no cover coat per se is used. Instead, the desired pattern (electrode, wiring harness, etc.) is printed on a "decal layer" or heat transfer decal (Meyer Cord, Inc., a division of Illinois tool works, Carroll Stream, Ill.), step 200, FIG. 10. This decal is the placed ink side down on the touchscreen, step 202. Then, using a silicone heated pad or roller, the pattern is transferred to the touch screen, step 204.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A method of applying an edge electrode pattern to a touch screen panel, the method comprising:
   depositing an edge electrode pattern on a decal layer;
   applying a cover coat over the electrode pattern;
   removing the decal layer; and
   transferring the edge electrode pattern to a touch screen panel.

2. The method of claim 1 in which the step of depositing the edge electrode pattern on the decal layer includes printing the edge electrode pattern on the decal layer around the perimeter thereof.

3. The method of claim 2 in which printing includes the use of conductive ink.

4. The method of claim 1 in which the step of applying a cover coat includes the use of acrylic lacquer material as the cover coat.

5. The method of claim 1 in which the decal layer is paper with a starch coating on at least one surface thereof and the step of depositing includes disposing the edge electrode pattern on the starch coated surface.

6. The method of claim 1 in which the decal layer is paper with a wax coating on at least one surface thereof and the step of depositing includes disposing the edge electrode pattern on the wax coated surface.

7. The method of claim 5 in which the step of removing the decal layer includes dissolving the starch coating and removing the cover coat and edge electrode pattern from the decal layer.

8. The method of claim 6 in which the step of removing the decal layer includes melting the wax coating and removing the cover coat and edge electrode pattern from the decal layer.

9. The method of claim 1 in which the step of transferring includes placing the cover coat and edge electrode pattern on the touch screen and heating the touch screen to burn off the cover coat and to bond the electrode pattern to the touch screen pattern.

10. The method of claim 1 further including the deposition of conductive lands over the decal layer before the cover coat is applied.

11. The method of claim 10 in which the step of depositing the conductive lands includes printing an insulative layer over selected portions of the edge electrode pattern and printing conductive lands on the insulative layer.

12. The method of claim 11 in which the insulative layer is a dielectric material.

13. The method of claim 10 further includes applying at least one of a noise shield layer and a protective layer over the conductive lands before the cover coat is applied.

14. The method of claim 11 in which transferring includes placing the cover coat and the insulative layer on the touch screen panel and heating the touch screen panel.

15. The method of claim 10 in which the step of depositing the conductive land includes printing an insulative border layer on the decal layer proximate the edge electrode pattern and printing the conductive lands on the insulative border layer.

16. The method of claim 15 in which the step of transferring includes placing the cover coat on the touch screen panel with the edge electrode pattern located peripherally on one surface of the touch screen and folding the insulative border layer on to an opposite surface of the touch screen panel to locate the conductive lands peripherally about the opposite surface of the touch screen panel.

17. A method of applying a conductive edge electrode pattern to a touch screen panel, the method comprising:
   depositing a conductive edge electrode pattern on a decal layer;
   applying a cover coat over the conductive edge electrode pattern;
   removing the decal layer; and
   transferring the conductive edge electrode pattern to a touch screen panel.

18. A method of applying an edge electrode pattern to a touch screen panel, the method comprising:
   depositing an edge electrode pattern on a decal layer;
   applying a cover coat over the edge electrode pattern;
   removing the decal layer; and
   transferring the edge electrode pattern to a touch screen panel.

19. A method of applying an edge electrode pattern to a touch screen panel, the method comprising:
   depositing an edge electrode pattern on a decal layer;
   assembling the decal layer on a touch screen panel; and
   applying heat and pressure to the decal layer to transfer the edge electrode pattern to the touch screen panel.

20. A method of applying an edge electrode pattern to a touch screen panel, the method comprising:
   depositing an edge electrode pattern on a decal layer;
   applying a cover coat over the electrode pattern;
   removing the decal layer;
   transferring the edge electrode pattern to a touch screen panel; and
   heating the touch screen to bond the electrode pattern to the touch screen pattern.

21. The method of claim 20 in which the decal layer is a heat transfer decal and the step of depositing includes depositing the edge electrode pattern printed with an ink on the heat transfer decal layer.

22. The method of claim 21 in which the step of removing the decal layer includes placing the ink side down on the touch screen and, using a silicone heated pad or roller, transferring the pattern to the touch screen.

23. A method of applying an edge electrode pattern to a touch screen panel, the method comprising:

depositing a conductive compound in the pattern of edge electrodes on a decal layer;

applying a cover coat over the edge electrode pattern;

removing the decal layer;

transferring the edge electrode pattern to a touch screen panel with an insulative substrate and a resistive layer thereon, such that the edge electrode pattern is disposed on the resistive layer about the periphery of the panel; and heating the panel until the conductive compound fuses into the resistive layer and becomes in intimate electrical contact with the resistive layer forming an electrical and mechanical bond with the resistive layer.

\* \* \* \* \*

UNITED STATES PATENT AND TRADEMARK OFFICE
CERTIFICATE OF CORRECTION

PATENT NO. : 6,280,552 B1
DATED : August 28, 2001
INVENTOR(S) : Frank J. Bottari It is certified that error appears in the above-identified patent and that said Letters Patent is hereby corrected as shown below:

Title page,
The word "AND" should read -- AN --

Column 3,
Line 30, "on a least on" should read -- on at least one --

Column 4,
Line 37, "win" should read -- will --

Column 8,
Line 16, "typical" should read -- typically --
Line 43, "provide" should read -- provides --
Line 66, "his" should read -- this --

Signed and Sealed this

Ninth Day of April, 2002

*Attest:*

*Attesting Officer*

JAMES E. ROGAN
*Director of the United States Patent and Trademark Office*